(12) United States Patent
Cai

(10) Patent No.: US 8,850,701 B2
(45) Date of Patent: Oct. 7, 2014

(54) METHOD FOR MANUFACTURING MULTILAYER PRINTED CIRCUIT BOARD HAVING MOUNTING CAVITY

(75) Inventor: Xue-Jun Cai, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 151 days.

(21) Appl. No.: 13/336,008

(22) Filed: Dec. 23, 2011

(65) Prior Publication Data

US 2012/0160803 A1   Jun. 28, 2012

(30) Foreign Application Priority Data

Dec. 28, 2010 (CN) .......................... 2010 1 0605544

(51) Int. Cl.
- *H05K 3/46* (2006.01)
- *H05K 1/18* (2006.01)
- *H05K 3/34* (2006.01)

(52) U.S. Cl.
CPC .............. *H05K 3/4697* (2013.01); *H05K 1/183* (2013.01); *H05K 3/3452* (2013.01); *H05K 2203/1383* (2013.01); *H05K 2201/0394* (2013.01); *H05K 3/4652* (2013.01)
USPC ................... 29/846; 29/847; 29/849; 29/852; 156/250; 156/253; 438/121; 174/250; 174/255

(58) Field of Classification Search
USPC ........... 29/832, 829, 830, 834, 842, 846, 852, 29/847, 849; 174/260, 250–257, 261–265; 438/584, 106, 121; 156/250, 252, 253, 156/257, 268
See application file for complete search history.

(56) References Cited

U.S. PATENT DOCUMENTS

| | | | |
|---|---|---|---|
| 5,784,782 A * | 7/1998 | Boyko et al. | 29/848 |
| 6,090,468 A * | 7/2000 | Shimada et al. | 428/137 |
| 8,067,695 B2 * | 11/2011 | Kaneko | 174/250 |
| 8,186,046 B2 * | 5/2012 | Tanaka | 29/832 |
| 8,516,694 B2 * | 8/2013 | Cai et al. | 29/852 |
| 2008/0117608 A1 * | 5/2008 | Seo et al. | 361/761 |
| 2009/0175017 A1 * | 7/2009 | Kita et al. | 361/792 |
| 2009/0244865 A1 * | 10/2009 | Tanaka | 361/764 |
| 2011/0138619 A1 * | 6/2011 | Dayan et al. | 29/830 |
| 2011/0203836 A1 * | 8/2011 | Yokota et al. | 174/250 |

FOREIGN PATENT DOCUMENTS

TW         201023312 A      6/2010

* cited by examiner

*Primary Examiner* — Peter DungBa Vo
*Assistant Examiner* — Kaying Kue
(74) *Attorney, Agent, or Firm* — Novak Druce Connolly Bove + Quigg LLP

(57) ABSTRACT

A method for manufacturing a multilayer PCB comprises the following steps. First, a PCB substrate includes a first circuit layer is provided. The first circuit layer includes a mounting portion. A first solder-resistant layer is formed on the mounting portion and a protective adhesive film is attached on the first solder-resistant layer. Next, a first copper foil, a first adhesive layer, a second copper foil, and a second adhesive layer are laminated on the PCB substrate, and the first and second copper foils are etched to form circuit layers. Then a cavity is defined and the protective adhesive film is exposed in it. After removing the protective adhesive film, an electronic component is mounted in the cavity. As such, a multilayer PCB with the electronic component embedded in is obtained.

7 Claims, 16 Drawing Sheets

METHOD FOR MANUFACTURING MULTILAYER PRINTED CIRCUIT BOARD HAVING MOUNTING CAVITY

BACKGROUND

1. Technical Field

The present disclosure relates to the manufacture of a multilayer printed circuit board (PCB).

2. Description of Related Art

Many electronic devices contain PCBs are widely used, such as mobile phones, printing heads, and hard disk drives. With the development of electronic technology, multilayer PCBs with electronic components embedded therein are replacing single-sided or double-sided PCBs.

Before embedding an electronic component in a multilayer PCB, a cavity is formed in the multilayer PCB for accommodating the electronic component. Traces are defined in a bottom surface of the cavity, to electrically connect with the electronic component. However, during the process of manufacturing the multilayer PCB, water, etchant, or other processing solution remains pooled in the cavity and reacts with the traces in the bottom surface of the cavity. As such, the structure and electrical properties of the traces are adversely affected, and an electrical connection between the electronic component and the multilayer PCB may be unreliable.

What is needed, therefore, is a method for manufacturing a multilayer PCB that overcomes the limitations described.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments will be described with reference to the drawings. In general, the terms "tape", "film" and "layer" as used hereinafter refer to distinct and separate components, each having a single fixed, independent, and differing function at all times, even if the material(s) or substance(s) of origin of one component is/are common between components.

Described below is a method for manufacturing a multilayer PCB, and the method includes the steps of:

(1) providing a PCB substrate, the PCB substrate comprising a base and a first circuit layer attached on the base, the first circuit layer comprising a mounting portion and an adjacent laminating portion;

(2) forming a first solder-resistant layer on the mounting portion;

(3) attaching a protective adhesive film on the first solder-resistant layer;

(4) laminating a first copper foil and a first adhesive layer on the PCB substrate, wherein the first adhesive layer defines a first opening and the protective adhesive film is positioned in the first opening;

(5) etching the first copper foil to form a second circuit layer, which defines a first window spatially corresponding to the protective adhesive film;

(6) laminating a second copper foil and a second adhesive layer on the PCB substrate in such a manner that the second adhesive layer covers the first window and is sandwiched between the second circuit layer and the second copper foil;

(7) etching the second copper foil to form a third circuit layer, which defines a second window spatially corresponding to a boundary of the protective adhesive film;

(8) forming a second solder-resistant layer on the third circuit layer, the second window being exposed from the second solder-resistant layer;

(9) defining a second opening in the second adhesive layer through the second window, the second window, the second opening, the first window, and the first opening communicating with each other and thereby cooperatively constituting a cavity; and

(10) removing the protective adhesive film, thereby obtaining a multilayer PCB with a cavity.

Figure 1:
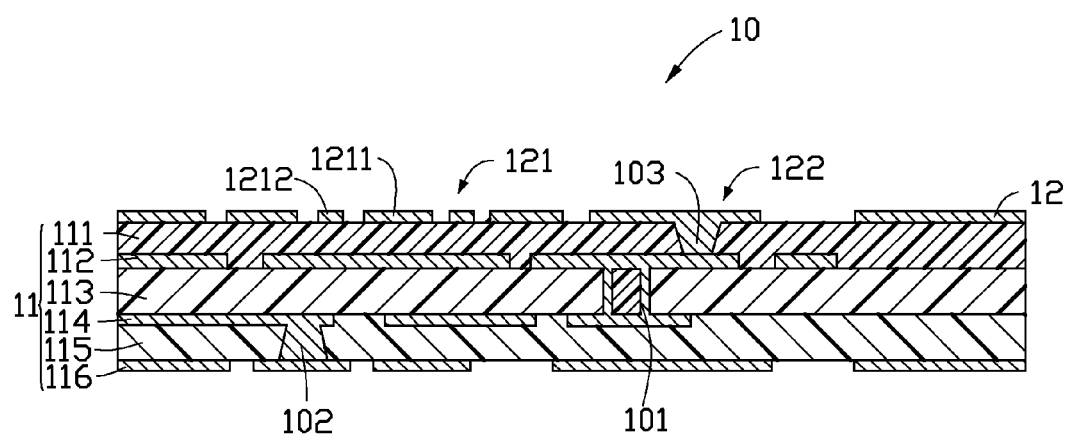
FIG. 1 is a cross sectional view of a PCB substrate in accordance with an exemplary embodiment, wherein the PCB substrate includes a first circuit layer and the first circuit layer includes a mounting portion and a laminating portion.

Referring to FIG. 1, in step (1), a PCB substrate 10 is provided. The PCB substrate 10 includes a base 11 and a first circuit layer 12. The base 11 can be a single-sided board, a double-sided board, or a multilayer board. In the illustrated embodiment, the base 11 is a three-layer board. The base 11 includes a first insulation layer 111, a first conductor layer 112, a second insulation layer 113, a second conductor layer 114, a third insulation layer 115, and a third conductor layer 116 laminated in sequence. The first to third conductor layers 112, 114, and 116 each have circuits formed therein. The material of the first to third insulation layers 111, 113, and 115 can be epoxy, polyimide, or poly(ethylene terephthalate), for example. The first insulation layer 111 is sandwiched between the first conductor layer 112 and the first circuit layer 12. The second insulation layer 113 is sandwiched between the first and second conductor layers 112 and 114. The third insulation layer 115 is sandwiched between the second and third conductor layers 114 and 116. The first and second conductor layers 112 and 114 are in electrical communication with each other by a buried via 101 defined in the second insulation layer 113. The buried via 101 is filled with plug-in insulation ink. The second and third conductor layers 114 and 116 are in electrical communication with each other by means of a first blind via 102 defined in the third insulation layer 115.

The first circuit layer 12 is positioned on a top surface of the base 11, i.e., a top surface of the first insulation layer 111. The first circuit layer 12 defines circuits therein. The first circuit layer 12 and the first conductor layer 112 electrically communicate with each other by means of a second blind via 103 defined in the first insulation layer 111. The first circuit layer 12 includes a mounting portion 121 and a laminating portion 122, wherein the laminating portion 122 is adjacent to and surrounds the mounting portion 121. There are two or more traces 1211 and two or more contacts 1212 defined in the mounting portion 121.

Figure 2:
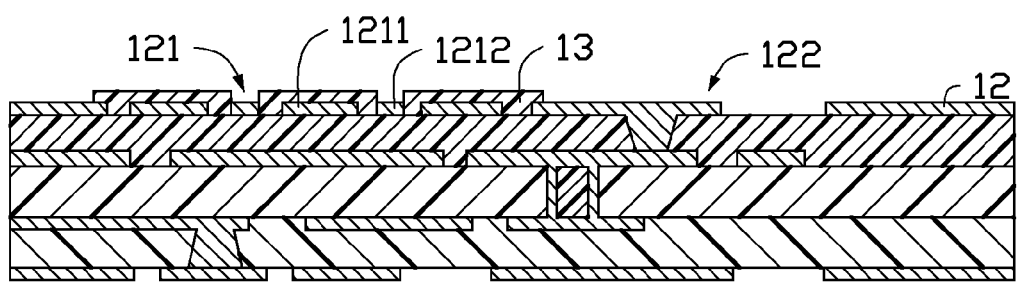
FIG. 2 is similar to FIG. 1, but shows a first solder-resistant layer being formed on the mounting portion of the first circuit layer.
Figure 3:
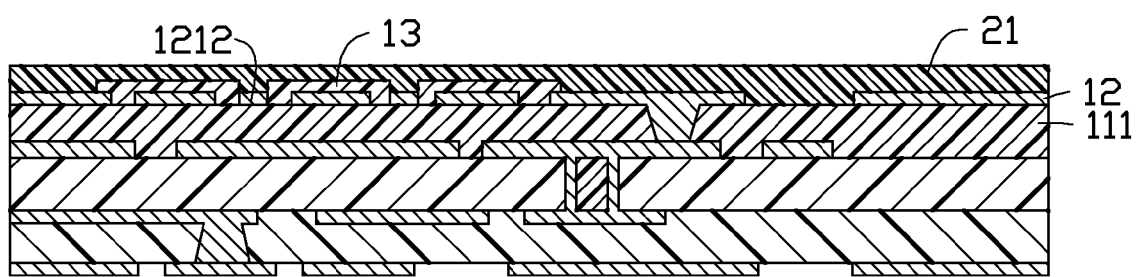
FIG. 3 is similar to FIG. 2, but shows a protective adhesive tape being attached on the first solder-resistant layer and the laminating portion of the first circuit layer.
Figure 4:
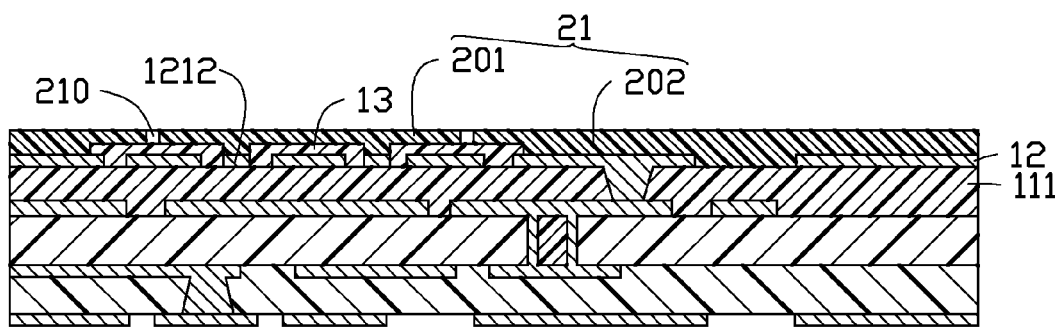
FIG. 4 is similar to FIG. 3, but showing an annular opening defined in the protective adhesive tape.
Figure 5:
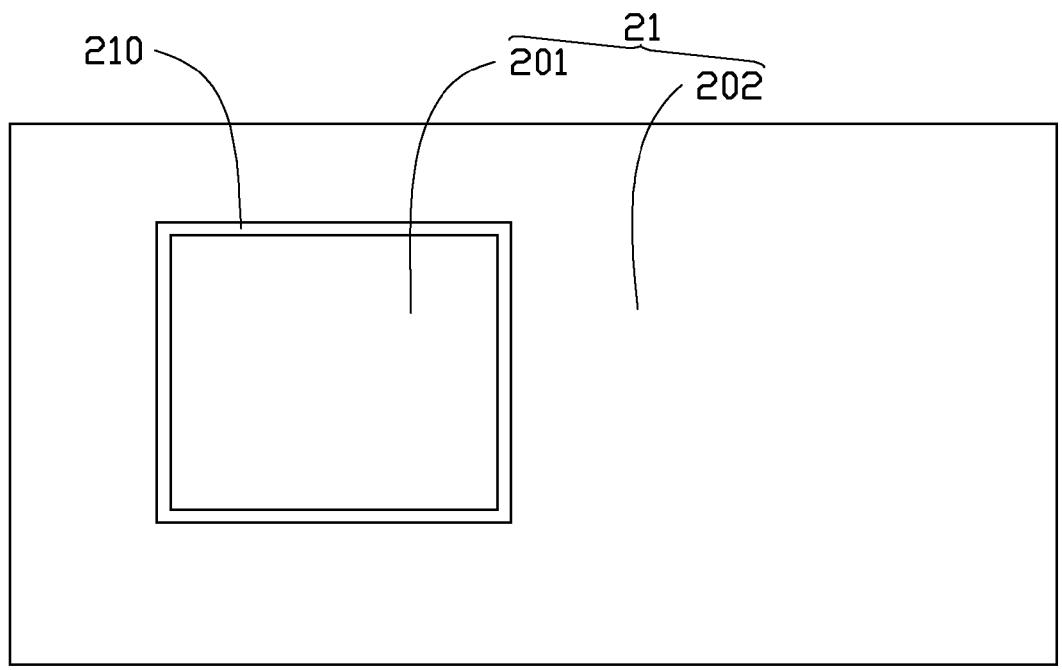
FIG. 5 is a top view of the objects of FIG. 4.

Referring to FIG. 2, in step (2), a first solder-resistant layer 13 is formed on the mounting portion 121 by screen printing technology or by spray coating technology. The traces 1211 are covered by the first solder-resistant layer 13, and the contacts 1212 are exposed from the first solder-resistant layer 13. It is noted that the first solder-resistant layer 13 also can cover a portion of the laminating portion 1212 adjacent to the mounting portion 121. Thus a cross-sectional area of the first solder-resistant layer 13 can be larger than that of the mounting portion 121.

Referring to FIGS. 3 to 6, in step (3), a protective adhesive film 20 is attached on the first solder-resistant layer 13. The protective adhesive film 20 can be poly(ethylene terephthalate) adhesive tape, or poly(tetrafluoroethylene) adhesive tape. In the illustrated embodiment, the cross-sectional area of the protective adhesive film 20 is a little less than that of the first solder-resistant layer 13, and is equal to that of the mounting portion 121. As such, the protective adhesive film 20 covers the first solder-resistant layer 13 of the mounting portion 121, and covers the contacts 1212 exposed from the first solder-resistant layer 13.

Figure 6:
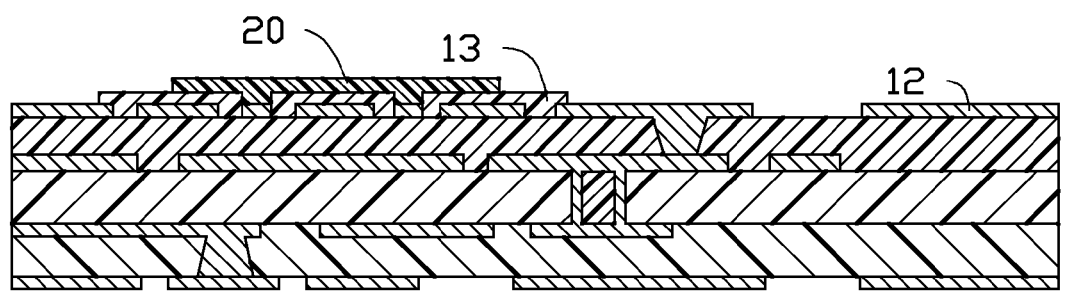
FIG. 6 is similar to FIG. 2, but shows a protective adhesive film being attached on the first solder-resistant layer.

In the illustrated embodiment, attaching the protective adhesive film 20 includes the following steps. First, referring to FIG. 3, a protective adhesive tape 21 is attached on a top side of the PCB substrate 10. That is, the protective adhesive tape 21 covers the surface of the first solder-resistant layer 13, the surface of the contacts 1212 being exposed from the first solder-resistant layer 13, the surface of the first circuit layer 12, and the surface of the first insulation layer 111 being exposed from the first circuit layer 12. Then, referring to FIGS. 4 and 5, a laser is used to cut the protective adhesive tape 21 along a boundary of the mounting portion 121 to form an annular slot 210. As such, the protective adhesive tape 21 is divided into a first portion 201 that is surrounded by the annular slot 210, and a second portion 202 outside of the annular slot 210. Finally, the second portion 202 is removed and the first portion 201 constitutes the protective adhesive film 20, as shown in FIG. 6.

Figure 7:
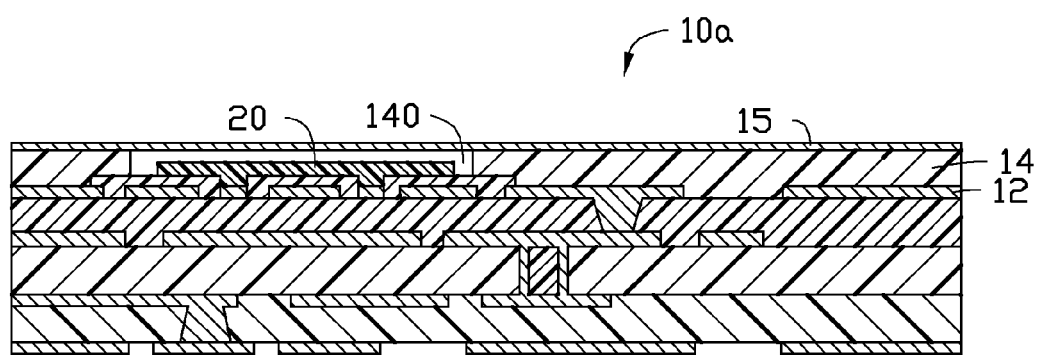
FIG. 7 is similar to FIG. 6, but shows a first adhesive layer and a first copper foil laminated on the PCB substrate, wherein the first adhesive layer defines a first opening and the protective adhesive film is positioned in the first opening.

Referring to FIG. 7, in step (4), a first adhesive layer 14 and a first copper foil 15 are provided and laminated on the PCB substrate 10.

The first adhesive layer 14 can be a self-adhesive sheet of prepreg, consisting of epoxy resin and glass fiber. The first adhesive layer 14 defines a first opening 140 spatially corresponding to the protective adhesive film 20. A cross-sectional area of the first opening 140 is greater than or equal to that of the protective adhesive film 20, and is less than that of the first solder-resistant layer 13.

Before laminating, the first adhesive layer 14 and the first copper foil 15 are aligned with the PCB substrate 10, wherein the first opening 140 is aligned with the protective adhesive film 20. Then the first adhesive layer 14 is sandwiched between the first circuit layer 12 and the first copper foil 15, and the protective adhesive film 20 is positioned in the first opening 140. In this way, a five-layer substrate 10a is obtained. Due to that the protective adhesive film 20 being positioned in the first opening 140, the first copper foil 15 lies very flat and smooth.

Figure 8:
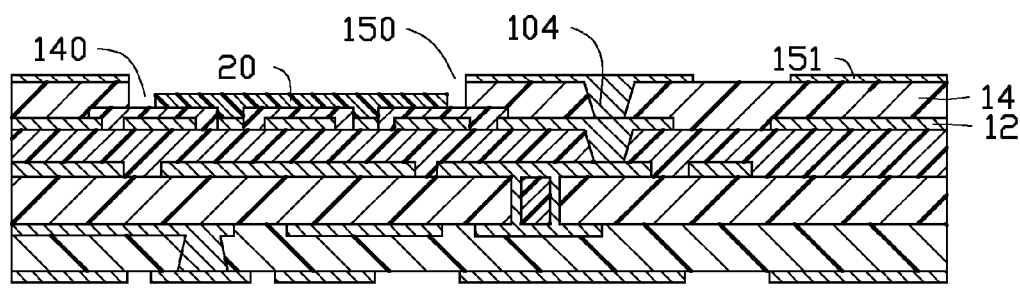
FIG. 8 is similar to FIG. 7, but shows the first copper foil being etched to form a second circuit layer, which includes circuits and a first window therein.

Referring to FIG. 8, in step (5), the first copper foil 15 is etched to form a second circuit layer 151. The second circuit layer 151 defines a first window 150 spatially corresponding to and vertically aligned with the protective adhesive film 20. The first window 150 communicates with the first opening 140, and thus the protective adhesive film 20 is exposed. In the illustrated embodiment, the first window 150 has a cross-sectional area equal to that of the first opening 140.

In the same step, a third blind via 104 positioned in the first adhesive layer 14 is defined to electrically connect the second circuit layer 151 to the first circuit layer 12. The second circuit layer 151 and the third blind via 104 can be formed by means of the following substeps. First, a blind hole through the first adhesive layer 14 and the first copper foil 15 is formed in the five-layer substrate 10a, using controlled depth drilling technology or laser drilling technology. Second, electrically conductive material, for example, copper, is deposited in the blind hole. Then the blind hole is formed into the third blind via 104, which electrically interconnects the first circuit layer 12 and the first copper foil 15. Next, the first copper foil 15 is etched by chemical solution or by laser beam, to remove portions thereof. In other words, the second circuit layer 151, with the first window 150 and circuits defined therein, is obtained. The surface of the first copper foil 15 being very flat facilitates the formation of precise circuits in the second circuit layer 151.

Figure 9:
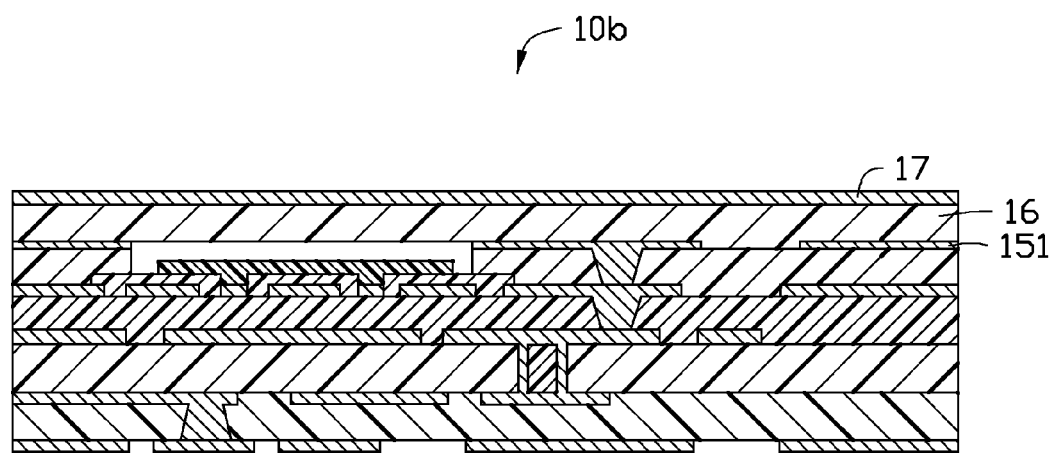
FIG. 9 is similar to FIG. 8, but shows a second adhesive layer and a second copper foil being laminated on the PCB substrate.

Referring to FIG. 9, in step (6), a second adhesive layer 16 and a second copper foil 17 are provided and laminated on the five-layer substrate 10a in such a manner that the second adhesive layer 16 is sandwiched between the second circuit layer 151 and the second copper foil 17, thereby forming a six-layer substrate 10b. The material of the second adhesive layer 16 is similar to that of the first adhesive layer 14. The second adhesive layer 16 covers the first window 150 and the first opening 140.

Figure 10:
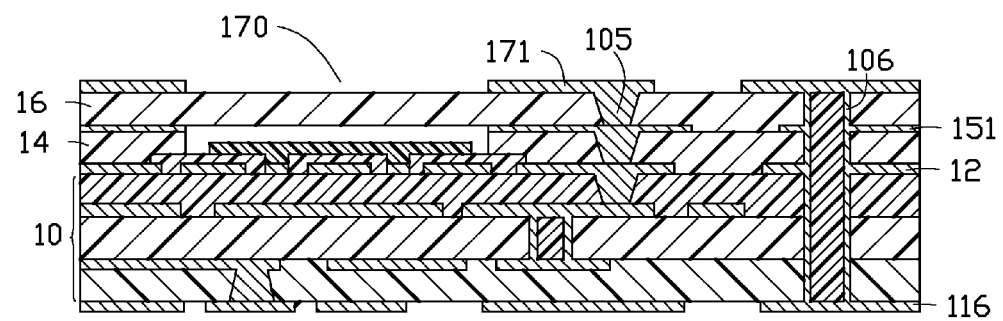
FIG. 10 is similar to FIG. 9, but shows the second copper foil being etched to form a third circuit layer, which defines a second window and circuits therein, in one embodiment.
Figure 11:
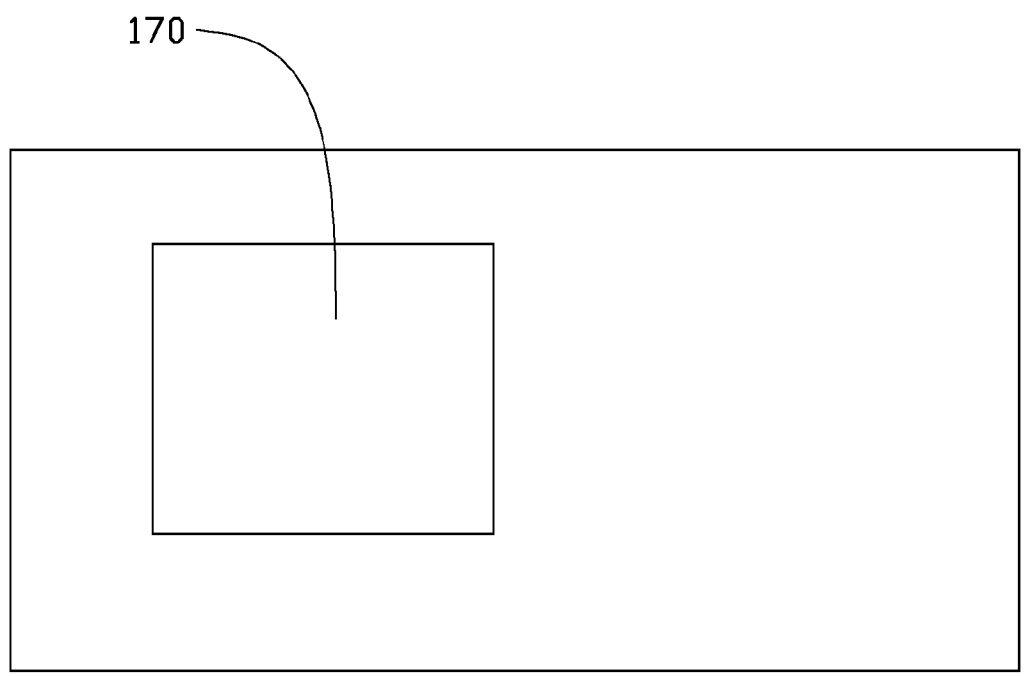
FIG. 11 is a top view of the objects of FIG. 10.
Figure 12:
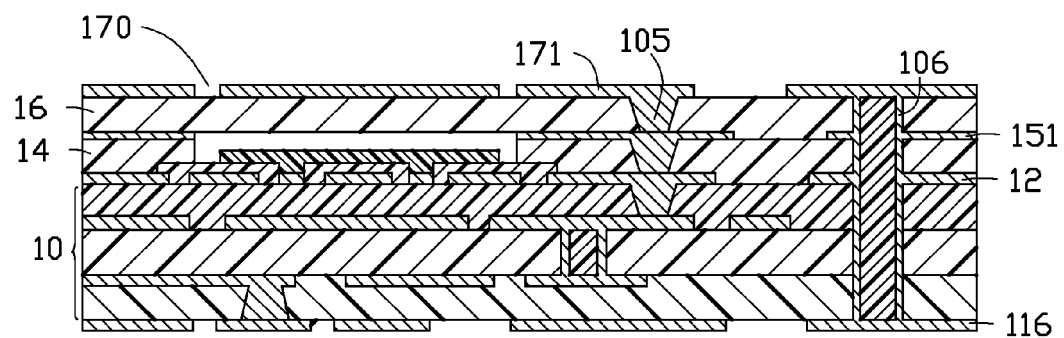
FIG. 12 is similar to FIG. 9, but shows the second copper foil being etched to form a third circuit layer, which defines a second window and circuits therein, in another embodiment.
Figure 13:
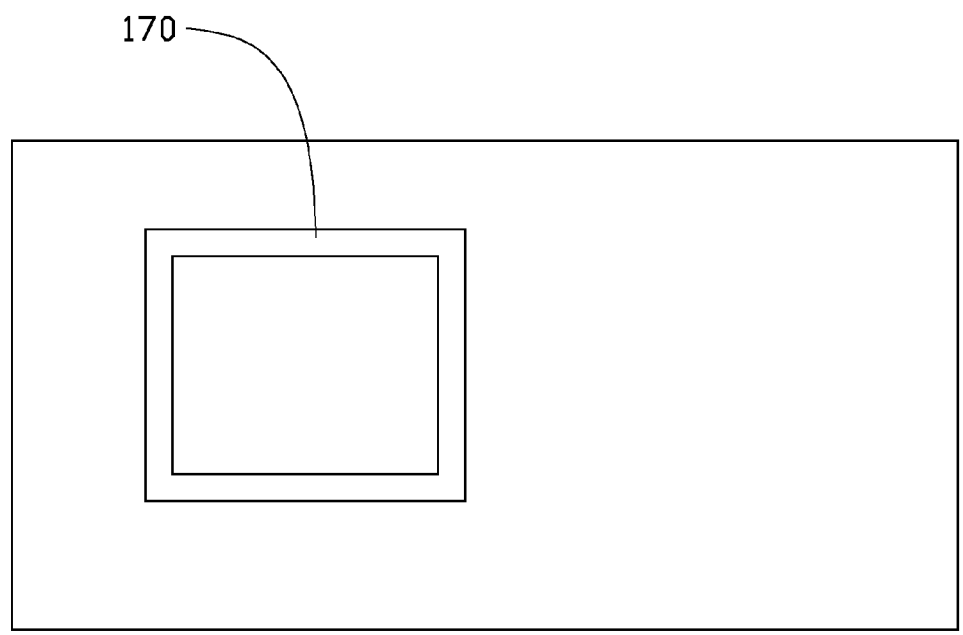
FIG. 13 is a top view of the objects of FIG. 12.

Referring to FIGS. 10 to 13, in step (7), the second copper foil 17 is etched to form a third circuit layer 171 using chemical solution or by laser. The third circuit layer 171 defines a second window 170, to expose a portion of the second adhesive layer 16 which corresponds to a boundary of the protective adhesive film 20. A projection of the protective adhesive film 20 on the third circuit layer 171 is located within the second window 170. In this embodiment, as shown in FIGS. 10 and 11, the second window 170 spatially corresponds to and vertically aligned with the first window 150, and has an area equal to that of the first window 150. In another embodiment as shown in FIGS. 12 and 13, the second window 170 is annular in shape, and has an outer boundary aligned with the first window 150. It is noted that the circuits of the third circuit layer 171 are not shown in FIGS. 11 and 13.

Before etching the second copper foil 17, a fourth blind via 105 and a plated through hole 106 are defined in the six-layer substrate 10b. The method of forming the fourth blind via 105 is similar to that of forming the third blind via 104. The method of forming the plated through hole 106 includes the following steps. First, the six-layer substrate 10b is drilled to form a through hole. Then, electrically conductive material, such as copper, is deposited at an inner wall of the through hole. After that, the through hole is filled with plug-in insulation ink, and electrically conductive material is deposited on the plug-in insulation ink. In this way, the plated through hole 106 is obtained.

After etching the second copper foil 17 to form the second circuit layer 171, the fourth blind via 105 electrically connects the second circuit layer 171 and the first circuit layer 151, the plated through hole 106 electrically connects the third circuit layer 171, the second circuit layer 151, the first circuit layer 12, and the third conductor layer 116.

Figure 14:
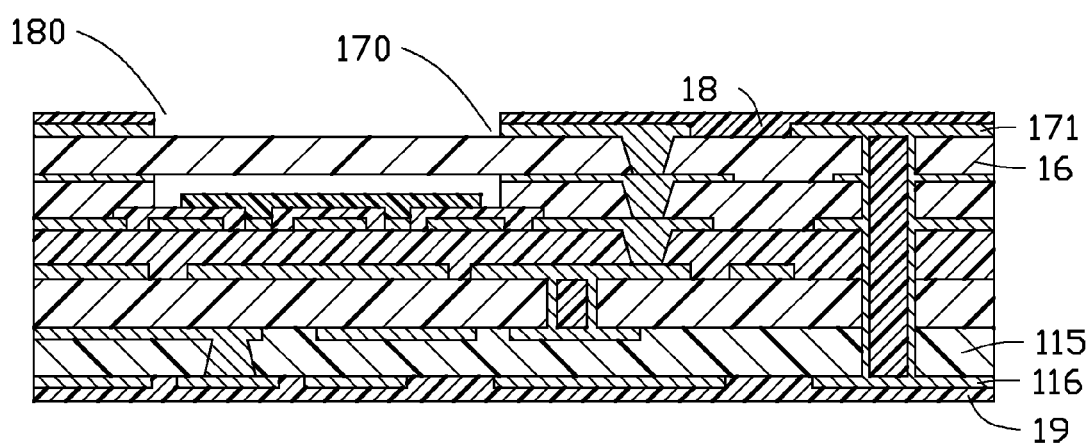
FIG. 14 is similar to FIG. 10, but shows a second resistant layer being formed on the third circuit layer.

Referring to FIG. 14, in step (8), a second solder-resistant layer 18 is formed on the third circuit layer 171. The second window 170 is exposed from the second solder-resistant layer 18. In other words, the second solder-resistant layer 18 defines a third window 180 corresponding to and communicating with the second window 170.

In the illustrated embodiment, a third solder-resistant layer 19 is formed on the third conductor layer 116 in this step. It is understood that the third solder-resistant layer 19 also can be formed in step (2).

Figure 15:
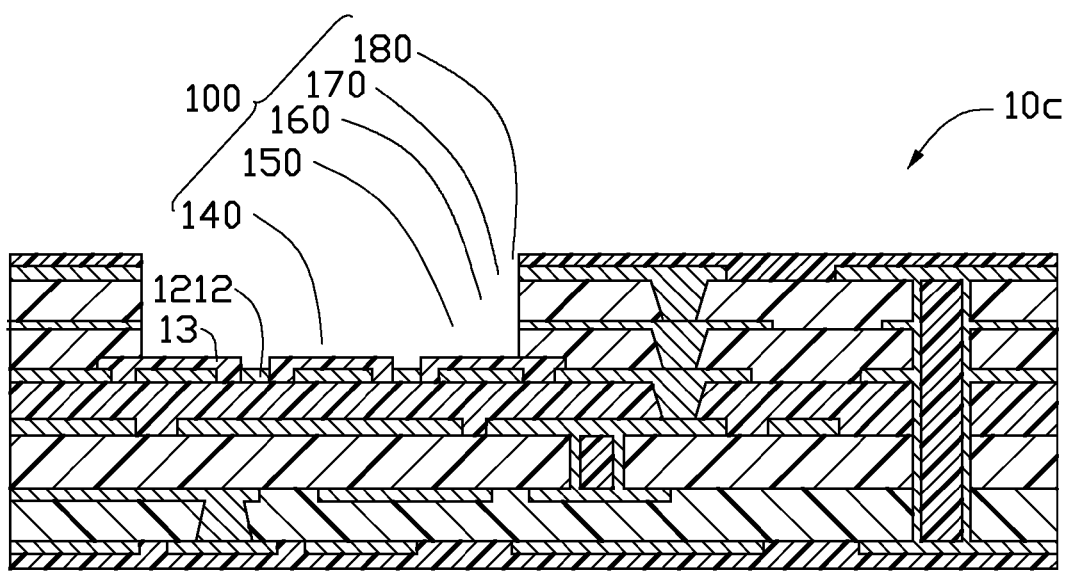
FIG. 15 is similar to FIG. 14, but shows a second opening being defined in the second insulation layer and the protective adhesive film being removed, wherein the second window, the second opening, the first window, and the first opening constitute a cavity.

Referring to FIG. 15, in step (9), a second opening 160 is defined in the second adhesive layer 16 from the second window 170. The second opening 160 is spatially corresponding to the protective adhesive film 20, to expose the protective adhesive film 20. In other words, the projection of the protective adhesive film 20 on the first circuit layer 12 is located within that of the second opening 160. The third window 180, the second window 170, the second opening 160, the first window 150, and the first opening 140 communicate with each other, thereby cooperatively forming a cavity 100. The protective adhesive film 20 is exposed in the cavity 100.

In the illustrated embodiment, the second opening 160 is defined by using a laser to cut the second adhesive layer 16 along a boundary of the second window 170. Thus, a portion of the second adhesive layer 16, which is above of the protective adhesive film 20, can be removed, and then the second opening 160 can be defined. If the second window 170 is annular in shape, as shown in FIGS. 12 and 13, the material of the second copper foil 17 attached on the removed portion of the second adhesive layer 16 would be removed simultaneously.

Referring to FIG. 15, in step (10), the protective adhesive film 20 is removed, thereby obtaining a six-layer PCB 10c having the cavity 100. The contacts 1212 of the mounting portion 121 are exposed in the cavity 100.

One of ordinary skill in the art understood that a multilayer PCB with more or less layers also can be manufactured by the above-mentioned steps. For example, an eight-layer PCB can be obtained by laminating the first adhesive layer 14, the first copper foil 15, the second adhesive layer 16, and the second copper foil 17 on two opposite sides of the PCB substrate 10.

Figure 16:
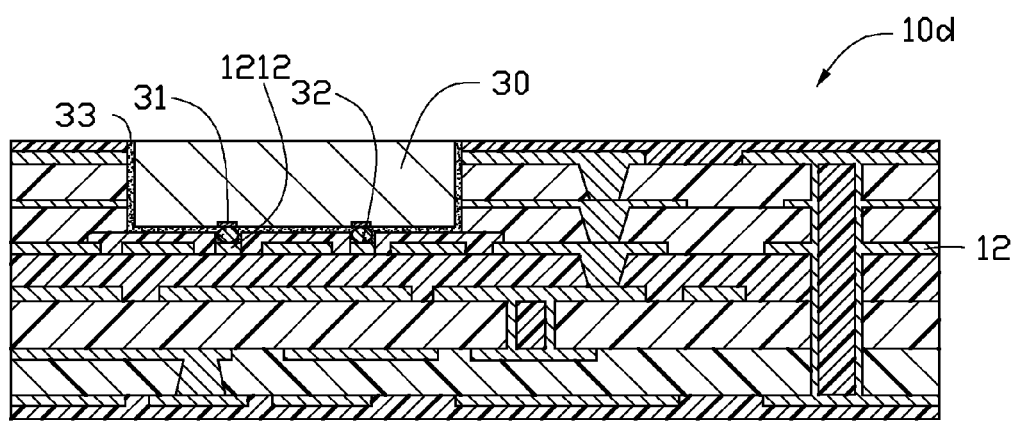
FIG. 16 is similar to FIG. 15, but shows an electronic component mounted in the cavity.

Referring to FIG. 16, after the step of removing the protective adhesive film 20, an electronic component 30 is mounted on the mounting portion 121 in the cavity 100, and electrically connected with the contacts 1212 of the mounting portion 121. The electronic component 30 can be an active component or a passive component, for example, can be a chip. The electronic component 30 includes two or more terminals 31, which correspond to the contacts 1212 one by one. The terminals 31 maybe leading foots, or solder bumps, for example. In the illustrated embodiment, the terminals 31 are electrically connected with the contacts 1212 with solder balls 32. Packaging material 33, such as epoxy resin, is filled between the electronic component 30 and the six-layer PCB 10c, to fix the electronic component 30 and protect the electrical connection between the electronic component 30 and the six-layer PCB 10c. According to the above-mentioned steps, a six-layer PCB 10d with the electronic component 30 is formed.

One of ordinary skill in the art understood that, if the PCB substrate 10 includes more than one mounting portion 101, then a multilayer PCB having more than one cavity 100 can be formed in step (10), and a multilayer PCB with more than one electronic component 30 embedded in can be obtained finally.

The above-mentioned method includes the following advantages. During the first laminating step, the protective adhesive film 20 and the first solder-resistant layer 13 can protect the traces 1211 and the contacts 1212 of the mounting portion 121, preventing them from being affected by etchant or other processing solutions. During the second laminating step, the second adhesive layer 16 prevents etchant from affecting elements in the first opening 140 and the first window 150. In all, the mounting portion 121 of the first circuit layer 12 is protected in the above-mentioned method, and thus, an electrical connection between the electronic component 30 and the six-layer PCB 10c is reliable.

It should be emphasized that the described embodiments of the present disclosure are merely possible examples of implementations, set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure is protected by the following claims.

The invention claimed is:

1. A method for manufacturing a multilayer PCB having a mounting cavity, comprising:

providing a PCB substrate, the PCB substrate comprising a base and a first circuit layer attached on the base, the first circuit layer comprising a mounting portion and an adjacent laminating portion;

forming a first solder-resistant layer on the mounting portion;

attaching a protective adhesive film on the first solder-resistant layer;

laminating a first copper foil and a first adhesive layer on the PCB substrate, wherein the first adhesive layer defines a first opening and the protective adhesive film is positioned in the first opening;

etching the first copper foil to form a second circuit layer, which comprises a first window spatially corresponding to the protective adhesive film;

laminating a second copper foil and a second adhesive layer on the PCB substrate in such a manner that the second adhesive layer covers the first window and is sandwiched between the second circuit layer and the second copper foil;

etching the second copper foil to form a third circuit layer, which comprises a second window spatially corresponding to a boundary of the protective adhesive film;

forming a second solder-resistant layer on the third circuit layer, the second window being exposed from the second solder-resistant layer;

defining a second opening in the second adhesive layer through the second window, the second window, the second opening, the first window, and the first opening communicating with each other and cooperatively constituting a cavity; and removing the protective adhesive film, thereby obtaining a multilayer PCB with a cavity.

2. The method of claim 1, wherein the base is a multilayer board.

3. The method of claim 1, wherein the laminating portion surrounds the mounting portion.

4. The method of claim 1, wherein a projection of the protective adhesive film on the third circuit layer is located within the second window.

5. The method of claim 4, wherein an area of the second window is equal to that of the first window.

6. The method of claim 4, wherein the second window is annular, and has an outer boundary aligned with the boundary of the first window.

7. The method of claim 1, wherein the step of attaching the protective adhesive film comprises:

attaching a protective adhesive tape on the PCB substrate to cover the first solder-resistant layer and the base;

cutting the protective adhesive tape along a boundary of the mounting portion to form an annular slot; and removing the material of the protective adhesive tape outside of the annular slot.

\* \* \* \* \*